(12) United States Patent
Wadatsumi

(10) Patent No.: US 8,310,311 B2
(45) Date of Patent: Nov. 13, 2012

(54) SEMICONDUCTOR INTEGRATED CIRCUIT DEVICE AND COMMUNICATION SYSTEM

(75) Inventor: Junji Wadatsumi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 34 days.

(21) Appl. No.: 12/886,700

(22) Filed: Sep. 21, 2010

(65) Prior Publication Data

US 2011/0221532 A1 Sep. 15, 2011

(30) Foreign Application Priority Data

Mar. 10, 2010 (JP) .................................. 2010-52965

(51) Int. Cl.
H03F 1/38 (2006.01)
(52) U.S. Cl. .................... 330/291; 330/301; 330/311
(58) Field of Classification Search .................... 330/85, 330/277, 279, 282, 291, 294, 311, 117, 253, 330/260, 261, 301
See application file for complete search history.

(56) References Cited

U.S. PATENT DOCUMENTS

| | | | |
|---|---|---|---|
| 5,146,116 A | 9/1992 | Sugimoto | |
| 6,600,371 B2* | 7/2003 | Cali | 330/254 |
| 7,489,200 B2* | 2/2009 | Chang et al. | 330/311 |
| 7,816,991 B2* | 10/2010 | Kervaon et al. | 330/279 |
| 7,940,122 B2* | 5/2011 | Satou | 330/282 |
| 2010/0301946 A1* | 12/2010 | Borremans | 330/294 |

FOREIGN PATENT DOCUMENTS

| | | |
|---|---|---|
| JP | 05-075438 | 3/1993 |
| JP | 2004-159195 | 6/2004 |
| WO | 2008/142051 | 11/2008 |

OTHER PUBLICATIONS

Borremans, et al. An ESD-Protected DC-to-6GHz 9.7mW LNA in 90nm Digital CMOS, 2007 IEEE International Solid-State Circuits Conference (ISSCC) Dig. Tech. Papers, pp. 422-423, 613.
Japanese Office Action for Japanese Patent Application No. 2010-052965 mailed on Jun. 5, 2012.

* cited by examiner

Primary Examiner — Khanh V Nguyen
(74) Attorney, Agent, or Firm — Turocy & Watson, LLP

(57) ABSTRACT

According to an embodiment, a semiconductor integrated circuit device includes an amplifier and a feedback circuit. The amplifier includes an input terminal receiving an input signal and an output terminal outputting an output signal. The feedback circuit includes a first transistor generating a bias current. The feedback circuit is configured to operate based on the bias current. The feedback circuit is configured to receive the output signal to supply a feedback signal to the input terminal. A signal having a reverse phase to the output signal is input to a gate of the first transistor.

15 Claims, 10 Drawing Sheets

(a)

(b)

(a)

(b)

SEMICONDUCTOR INTEGRATED CIRCUIT DEVICE AND COMMUNICATION SYSTEM

CROSS REFERENCE TO RELATED APPLICATIONS

This application is based upon and claims the benefit of priority from the prior Japanese Patent Application No. 2010-52965 filed on Mar. 10, 2010 in Japan, the entire contents of which are incorporated herein by reference.

FIELD

Embodiments described herein relate generally to a semiconductor integrated circuit device and a communication system.

BACKGROUND

As configurations of a low noise amplifier with broadband input matching, there are a resistive termination configuration, a common gate configuration, a resistor feedback configuration, and an active feedback configuration. Among these, the active feedback configuration using a common drain circuit is advantageous in noise, band width, and area and easily benefits from process miniaturization, and thus there is a high possibility that it will be widely used in the future.

In the common drain feedback low noise amplifier, a common drain circuit as a feedback path is connected between an input and an output of the amplifier (for example, see WO/2008/142051 Pamphlet). Since the common drain circuit is connected to the input, a bandwidth of input matching gets narrowed by a parasitic capacitance (an input capacitance) caused by the common drain circuit. The common drain circuit also acts as a noise source.

However, in the conventional common drain feedback low noise amplifier, it is difficult to reduce the input capacitance and the noise.

DETAILED DESCRIPTION

According to an embodiment, a semiconductor integrated circuit device includes an amplifier and a feedback circuit. The amplifier includes an input terminal receiving an input signal and an output terminal outputting an output signal. The feedback circuit includes a first transistor generating a bias current. The feedback circuit is configured to operate based on the bias current. The feedback circuit is configured to receive the output signal to supply a feedback signal to the input terminal. A signal having a reverse phase to the output signal is input to a gate of the first transistor.

Before describing embodiments of the present invention, a common drain feedback low noise amplifier (hereinafter, referred to as "low noise amplifier") of a comparative example, known to the inventor of the present application, will be described.

Figure 1:
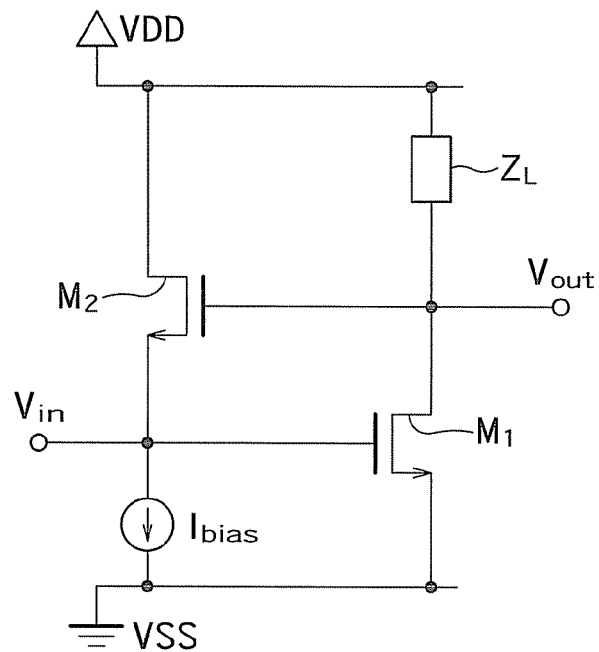
FIG. 1 is a circuit diagram of a low noise amplifier according to a comparative example.

FIG. 1 is a circuit diagram of a conventional and general low noise amplifier according to a comparative example. The low noise amplifier amplifies an input signal $V_{in}$ input from an input terminal with low noise and outputs an output signal $V_{out}$. An NMOS transistor $M_1$ and a load $Z_L$ configure an amplifier. An NMOS transistor $M_2$ and a current source $I_{bias}$ configure a common drain circuit. The common drain circuit supplies the input terminal with a feedback signal based on the output signal $V_{out}$.

Input impedance $Z_{in}$ of the circuit is expressed by Equation (1). Here, a parasitic capacitance is not considered.

$$Z_{in} = \frac{1}{(1 + g_{m1} Z_L) g_{m2}} \quad (1)$$

Here, $g_{m1}$ and $g_{m2}$ represent mutual conductances of the NMOS transistors $M_1$ and $M_2$, respectively. In order to match the input impedance $Z_{in}$ with signal source impedance $R_s$, $g_{m2}$ of the NMOS transistor $M_2$ whose drain is grounded is set to satisfy Equation (2).

$$g_{m2} = \frac{1}{(1 + g_{m1} Z_L) R_s} \quad (2)$$

Figure 2:
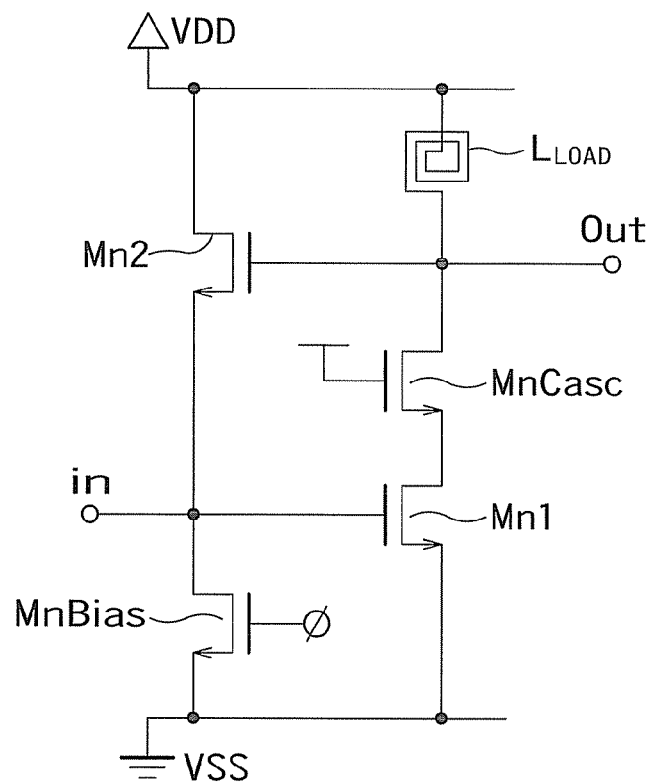
FIG. 2 is a circuit diagram illustrating a configuration of a low noise amplifier according to the comparative example.

In an actual circuit, a MOS transistor is used as the current source $I_{bias}$. FIG. 2 is a circuit diagram illustrating a configuration of a low noise amplifier according to a comparative example. The low noise amplifier is different in the following points from the low noise amplifier of FIG. 1 but is the same in the basic operation.

An NMOS transistor $M_{nBias}$ receives a bias voltage through a gate and functions as a current source that supplies the NMOS transistor $M_{n2}$ with a bias current. In the low noise amplifier, an inductor $L_{LOAD}$ is used as a load, and an NMOS transistor $M_{nCasc}$ is cascode-connected between the inductor $L_{LOAD}$ and a drain of an NMOS transistor $M_{n1}$.

In the configuration of FIG. 2, an input node "in" is connected to a source of the NMOS transistor $M_{n2}$ and a drain of the NMOS transistor $M_{nBias}$. Since the transistor acts as the noise source, in order to reduce the noise, it is necessary to reduce the mutual conductances of the two NMOS transistors as much as possible. Further, the parasitic capacitance of the input node deteriorates input matching of a high frequency area and causes a bandwidth of input matching to be narrowed. Therefore, it is necessary to reduce the parasitic capacitance. For these reasons, it is necessary to reduce the sizes of the NMOS transistors $M_{n2}$ and $M_{nBias}$ as much as possible. However, since the mutual conductance of the NMOS transistor $M_{n2}$ is determined as in Equation (2) and an adjustment range thereof is limited, the inventor of the present application uniquely found out that there is a limit in a range of adjusting the sizes of the NMOS transistors $M_{n2}$ and $M_{nBias}$.

The inventor of the present application completed the present invention based on the knowledge uniquely found out above.

Hereinafter, embodiments of the present invention will be described with reference to the accompanying drawings. The present invention is not limited to the embodiments.

(First Embodiment)

In the present embodiment, a signal having a phase reverse to an output signal is input to a gate of a transistor used as a bias current source of a common drain circuit as a feedback path.

First, an example of a system using a low noise amplifier will be described.

Figure 3:
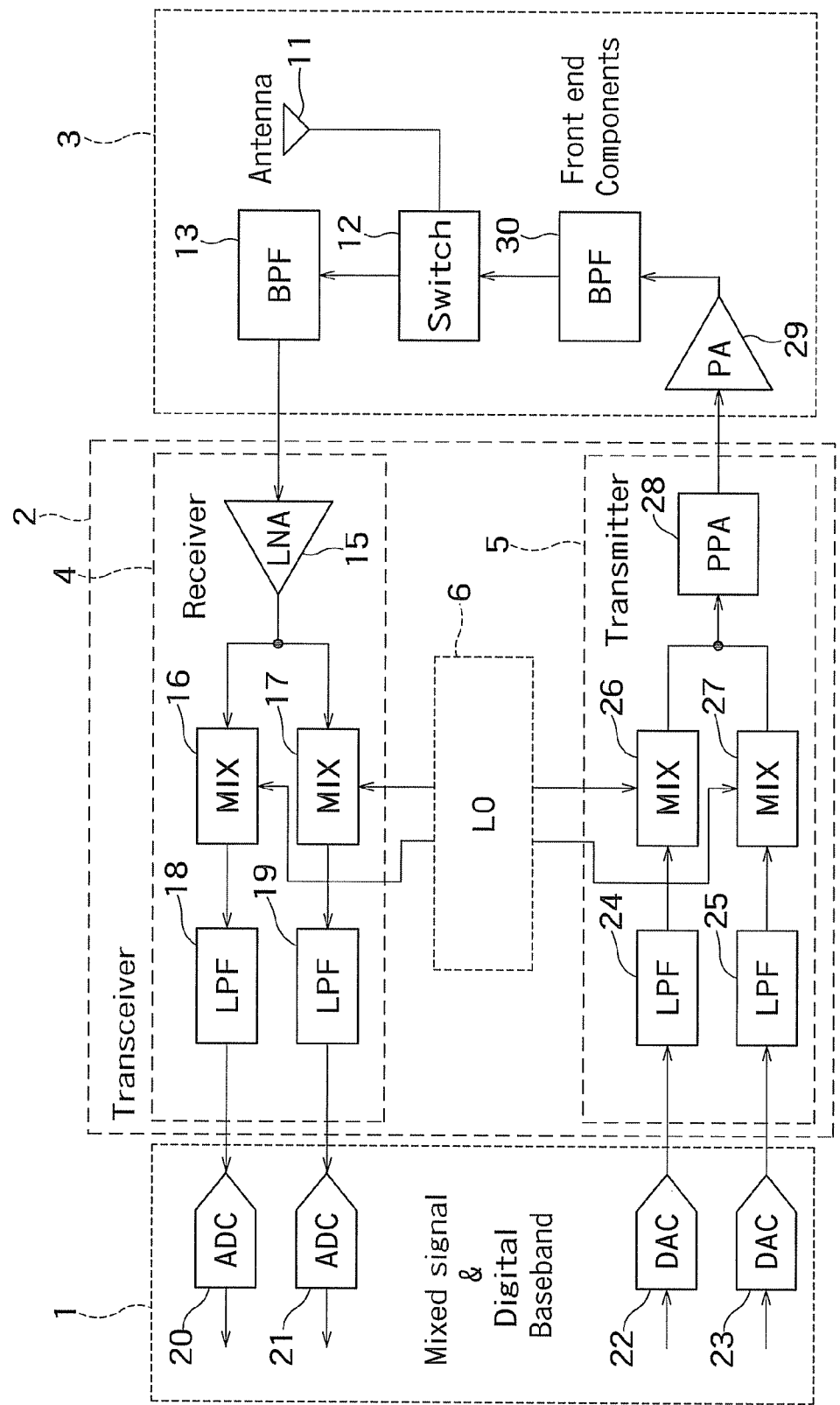
FIG. 3 is a block diagram of a system using a low noise amplifier according to a first embodiment of the present invention.

FIG. 3 is a block diagram of a system using a low noise amplifier according to a first embodiment of the present invention. As illustrated in FIG. 3, the system includes a baseband section 1, a transceiver 2, and a front end section 3. The transceiver 2 includes a receiver 4, a transmitter 5, and a local frequency oscillator 6. The low noise amplifier of the present embodiment is used in the receiver 4.

A receiving side operation of the system will be described. A receiving signal of a high frequency, received by an antenna 11, is input to a low noise amplifier (LNA) 15 through a switch 12 and a band pass filter (BPF) 13. The low noise amplifier 15 amplifies the input signal with low noise and outputs the amplified signal. Frequency mixers 16 and 17 convert the output signal of the low noise amplifier 15 to low frequency signals based on signals from the local frequency oscillator 6. The low frequency signal is converted to a digital signal through a low pass filter (LPF) 18 and 19 and analog-to-digital (AD) converters 20 and 21, and then baseband-processed.

A transmitting side operation of the system will be described. In the baseband section 1, a baseband signal is converted to an analog signal through digital-to-analog (DA) converters 22 and 23. The analog signal is converted to a high frequency signal in frequency mixers 26 and 27 through low pass filters 24 and 25. The high frequency signal is amplified by a pre-power amplifier (PPA) 28 and then additionally amplified by a power amplifier (PA) 29. The amplified signal is transmitted from the antenna 11 through a band pass filter 30 and the switch 12.

Figure 4:
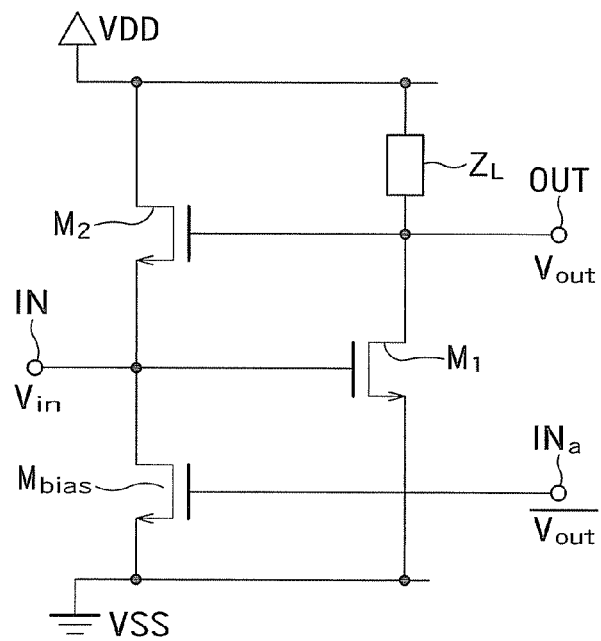
FIG. 4 is a circuit diagram of the low noise amplifier according to the first embodiment of the present invention.

FIG. 4 is a circuit diagram of the low noise amplifier according to the first embodiment of the present invention. As illustrated in FIG. 4, the low noise amplifier includes an NMOS transistor $M_1$ (a third transistor), an NMOS transistor $M_2$ (a second transistor), an NMOS transistor $M_{bias}$ (a first transistor), and a load $Z_L$ (a first load).

An input terminal IN is connected to a gate of the NMOS transistor $M_1$, a source of the NMOS transistor $M_2$, and a drain of the NMOS transistor $M_{bias}$. A source of the NMOS transistor $M_1$ is connected to a ground potential VSS (a second potential), and a drain thereof is connected to an output terminal OUT, a gate of the NMOS transistor $M_2$, and one terminal of the load $Z_L$. The other terminal of the load $Z_L$ is connected to a power-supply potential VDD (a first potential). A drain of the NMOS transistor $M_2$ is connected to the power-supply potential VDD. A gate of the NMOS transistor $M_{bias}$ is connected to an input terminal $IN_a$, and a source thereof is connected to the ground potential VSS.

The NMOS transistor $M_1$ and the load $Z_L$ configure an amplifier. The NMOS transistors $M_2$ and $M_{bias}$ configure a common drain circuit (a feedback circuit).

A bias voltage is applied to the gate of the NMOS transistor $M_{bias}$ so that the NMOS transistors $M_1$, $M_2$, and $M_{bias}$ can operate in a saturated region. The bias current generated by the NMOS transistor $M_{bias}$ flows to the NMOS transistor $M_2$. A predetermined bias current flows to the NMOS transistor $M_1$ and the load $Z_L$.

The input impedance of the input terminal IN is power-matched with the signal source impedance in a predetermined bandwidth. The input signal $V_{in}$ input to the input terminal IN is amplified with low noise, and an output signal $V_{out}$ is output from the output terminal OUT.

The common drain circuit receives the output signal $V_{out}$ and supplies the input terminal IN with a first feedback signal. A signal having a phase reverse to the output signal $V_{out}$ is input to the input terminal $IN_a$. The NMOS transistor $M_{bias}$ receives the signal having the phase reverse to the output signal $V_{out}$ and supplies the input terminal IN with a second feedback signal.

As described above, in the present embodiment, the signal having the phase reverse to the signal input to the gate of the NMOS transistor $M_2$ is input to the gate of the NMOS transistor $M_{bias}$, and thus a feedback path having the NMOS transistor $M_{bias}$ therein can be added to a path having the NMOS transistor $M_2$ therein which is a only one feedback path in the comparative example. Since the two feedback paths are provided, a feedback signal increases.

The input impendence $Z_{in}$ of the circuit of FIG. 4 can be computed as in Equation (3). Here, the parasitic capacitance is not considered.

$$Z_{in} = \frac{1}{(1 + g_{m1}Z_L)g_{m2} + g_{m1}Z_L g_{mbias}} \quad (3)$$

Thus, $g_{m2}$ for matching the input impedance $Z_{in}$ with the signal source impedance $R_s$ can be expressed as in Equation (4).

$$g_{m2} = \frac{1}{(1 + g_{m1}Z_L)R_s} - \frac{g_{m1}Z_L}{1 + g_{m1}Z_L} g_{mbias} \quad (4)$$

Comparing Equation (4) with Equation (2) of the comparative example, it can be understood that $g_{m2}$ may be reduced by a second term of Equation (4).

For easy understanding, an example in which the NMOS transistors $M_2$ and $M_{bias}$ are equal in size will be described in connection with points different from the comparative example. If the input impedance $Z_{in}$ is equal to that in the comparative example, and the NMOS transistors $M_2$ and $M_{bias}$ are equal in size, as can be seen from Equations (1) and (3), $g_{m2}$ of the present embodiment is as $((1+g_{m1}Z_L)/(1+2g_{m1}Z_L))$ times as $g_{m2}$ of the comparative example. Therefore, if $g_{m1}Z_L$ is sufficiently large, it is possible to realize matching by using $g_{m2}$ that is about half of that in the comparative example. That is, in the above condition, it is possible to realize matching by using the NMOS transistor $M_2$ whose size is about half of that in the comparative example. At this time, the bias current flowing to the NMOS transistors $M_2$ and $M_{bias}$ is about half of that in the comparative example, and thus the size of the NMOS transistor $M_{bias}$ can be about half. As described above, as $g_{m2}$ decreases, the parasitic capacitance of the input node (the input terminal IN) decreases. For the NMOS transistor $M_{bias}$, since a signal is merely input to the transistor originally used as the current source, the parasitic capacitance of the input node does not increase.

Further, the NMOS transistors $M_2$ and $M_{bias}$ connected to the input node act as the noise source, but since their size can be reduced as described above, $g_{m2}$ and $g_{mbias}$ can be half of a value of the comparative example, thereby reducing the noise.

As described above, according to the present embodiment, the signal having the phase reverse to the output signal $V_{out}$ is input to the gate of the transistor $M_{bias}$ used as the bias current source of the common drain circuit as the feedback path. Therefore, it is possible to increase a feedback signal (a negative feedback signal) without adding a transistor. As a result, even though $g_{m2}$ of the NMOS transistor $M_2$ is smaller than that in the comparative example, the same input impendence as in the comparative example is obtained. Therefore, since the sizes of the NMOS transistors $M_2$ and $M_{bias}$ can be smaller than the sizes of those in the comparative example, the parasitic capacitance of the input terminal IN can be reduced. Further, since $g_{m2}$ and $g_{mbias}$ can be smaller than those in the comparative example, the noise can be reduced.

The example in which the NMOS transistors $M_2$ and $M_{bias}$ are equal in size has been described above, but even when the NMOS transistors $M_2$ and $M_{bias}$ are different in size, the above-described effect is obtained.

(Second Embodiment)

The present embodiment relates to a circuit in which two low noise amplifies of the first embodiment are connected in parallel to provide a differential configuration.

Figure 5:
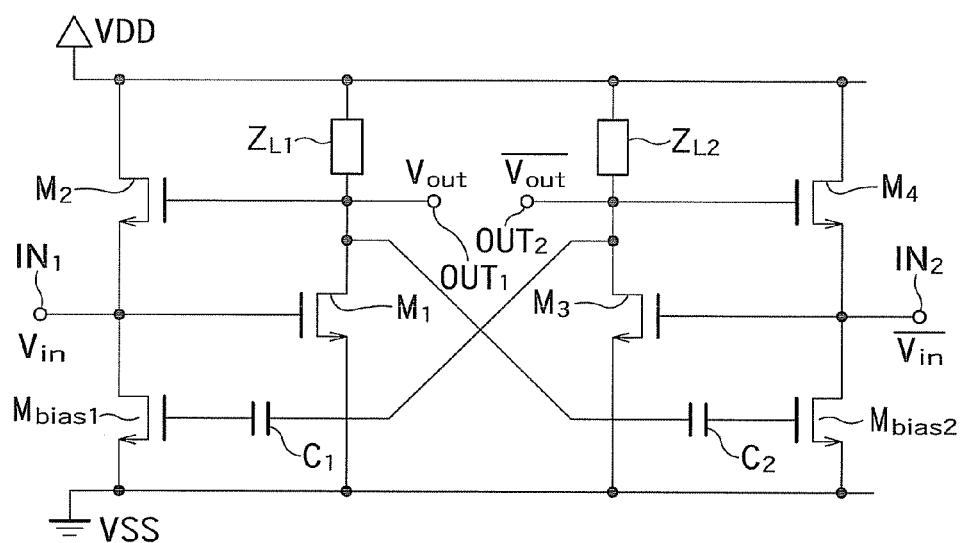
FIG. 5 is a circuit diagram of a low noise amplifier according to a second embodiment of the present invention.

FIG. 5 is a circuit diagram of a low noise amplifier according to a second embodiment of the present invention. As illustrated in FIG. 5, the low noise amplifier includes an NMOS transistor $M_1$, an NMOS transistor $M_2$, an NMOS transistor $M_{bias1}$ a load $Z_{L1}$, an NMOS transistor $M_3$, an NMOS transistor $M_4$, an NMOS transistor $M_{bias2}$, a load $Z_{L2}$, a capacitor $C_1$ (a first capacitor), and a capacitor $C_2$ (a second capacitor).

An input terminal $IN_1$ is connected to a gate of the NMOS transistor $M_1$, a source of the NMOS transistor $M_2$, and a drain of the NMOS transistor $M_{bias1}$. A source of the NMOS transistor $M_1$ is connected to a ground potential VSS, and a drain thereof is connected to an output terminal $OUT_1$, a gate of the NMOS transistor $M_2$, and one terminal of the load $Z_{L1}$. The other terminal of the load $Z_{L1}$ is connected to a power-supply potential VDD. A drain of the NMOS transistor $M_2$ is connected to the power-supply potential VDD. A gate of the NMOS transistor $M_{bias1}$ is connected to an output terminal $OUT_2$ through the capacitor $C_1$, and a source thereof is connected to the ground potential VSS.

An input terminal $IN_2$ is connected to a gate of the NMOS transistor $M_3$, a source of the NMOS transistor $M_4$, and a drain of the NMOS transistor $M_{bias2}$. A source of the NMOS transistor $M_3$ is connected to the ground potential VSS, and a drain thereof is connected to the output terminal $OUT_2$, a gate of the NMOS transistor $M_4$, and one terminal of the load $Z_{L2}$. The other terminal of the load $Z_{L2}$ is connected to the power-supply potential VDD. A drain of the NMOS transistor $M_4$ is connected to the power-supply potential VDD. A gate of the NMOS transistor $M_{bias2}$ is connected to the output terminal $OUT_1$ through the capacitor $C_2$, and a source thereof is connected to the ground potential VSS.

The NMOS transistors $M_1$, $M_2$, and $M_{bias1}$ configure a first low noise amplifier, and the NMOS transistors $M_3$, $M_4$, and $M_{bias2}$ configure a second low noise amplifier.

A bias voltage is applied to the gates of the NMOS transistors $M_{bias1}$ and $M_{bias2}$ so that the NMOS transistors $M_1$, $M_2$, $M_3$, $M_4$, $M_{bias1}$, and $M_{bias2}$ can operate in the saturated region.

The input impedances of the input terminals $IN_1$ and $IN_2$ are power-matched with the signal source impedance in a predetermined bandwidth. The input signal $V_{in}$ input to the input terminal $IN_1$ is amplified with low noise, and an output signal $V_{out}$ is output from the output terminal $OUT_1$. A signal having a phase reverse to an input signal $V_{in}$ input to the input terminal $IN_2$ is amplified with low noise, and a signal having a phase reverse to the output signal $V_{out}$ is output from the output terminal $OUT_2$.

The signal having the phase reverse to the output signal $V_{out}$ in the second low noise amplifier is input to the gate of the NMOS transistor $M_{bias1}$ in the first low noise amplifier. The output signal $V_{out}$ in the first low noise amplifier is input to the gate of the NMOS transistor $M_{bias2}$ in the second low noise amplifier.

The NMOS transistors $M_1$, $M_2$, and $M_{bias1}$ and the NMOS transistors $M_3$, $M_4$, and $M_{bias2}$ operate in the same manner as in the first embodiment, and thus description thereof will not be repeated.

As described above, since the differential configuration is provided using the two low noise amplifiers of the first embodiment, the signal having the reverse phase can be easily input to the NMOS transistors $M_{bias1}$ and $M_{bias2}$ by inputting the reverse phase side output signal.

Next, a characteristic comparison between a low noise amplifier of the present embodiment and a circuit in which a differential configuration is provided by a low noise amplifier of a comparative example will be described. Here, the comparison is made using comparative circuits in which the sizes of transistors are adjusted so that the both circuits can be equal in input impedance and gain.

Figure 6:
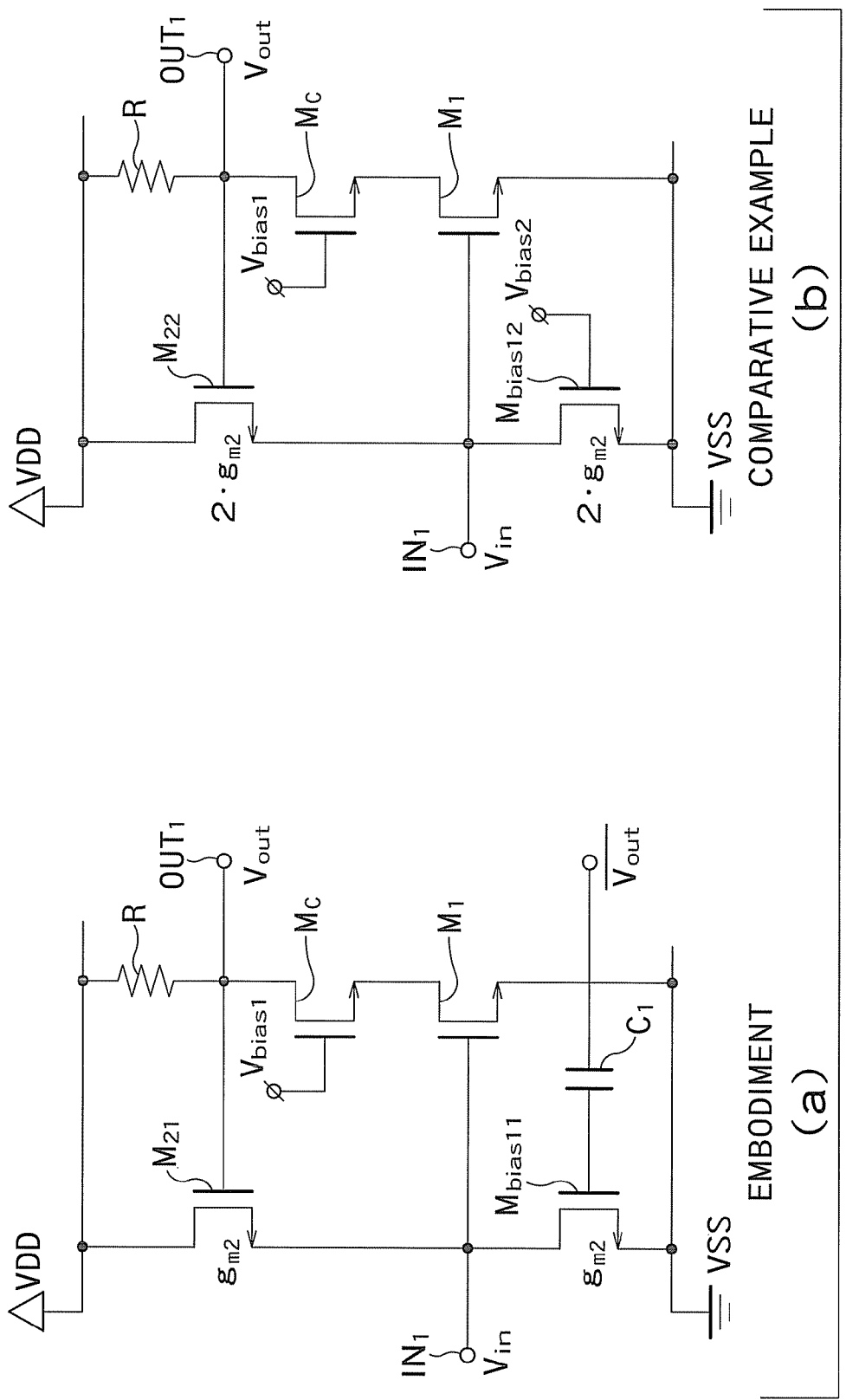
FIG. 6 is a circuit diagram of comparative circuits of the low noise amplifier according to the second embodiment of the present invention and the low noise amplifier according to the comparative example.

FIG. 6(a) is a circuit diagram of a comparative circuit of a low noise amplifier according to the second embodiment of the present invention. FIG. 6(b) is a circuit diagram of a comparative circuit of a low noise amplifier according to the comparative example. For easy understanding, only one side of the differential configuration is illustrated in FIGS. 6(a) and 6(b).

In each of the comparative circuits of FIGS. 6(a) and 6(b), a resistor R is used as a load, and an NMOS transistor $M_c$ is cascode-connected between the resistor R and a drain of the NMOS transistor $M_1$. A bias voltage $V_{bias1}$ is applied to the gate of the NMOS transistor $M_c$. A bias voltage $V_{bias2}$ is applied to gates of NMOS transistors $M_{bias1}$ and $M_{bias12}$.

Similarly to the first embodiment, when the input impedance of the circuit of the present embodiment is equal to that of the circuit of the comparative example, the mutual conductance of the common drain circuit (an NMOS transistor $M_{21}$) as the feedback path in the circuit of the present embodiment can be smaller than that of the circuit of the comparative example. Here, the NMOS transistors $M_{21}$ and $M_{bias11}$ are equal in size, and the NMOS transistors $M_{22}$ and $M_{bias12}$ are equal in size. In this condition, the mutual conductance $g_{m2}$ of each of the NMOS transistors $M_{21}$ and $M_{bias11}$ is about half of the mutual conductance $2g_{m2}$ of each of the NMOS transistors $M_{22}$ and $M_{bias12}$, so that a channel width of each of the NMOS transistors $M_{21}$ and $M_{bias11}$ is about half of a channel width of each of the NMOS transistors $M_{22}$ and $M_{bias12}$. In FIGS. 6(a) and 6(b), corresponding NMOS transistors have the almost same bias voltage, and a bias current flowing through the NMOS transistors $M_{21}$ and $M_{bias11}$ is about half of a bias current flowing through the NMOS transistors $M_{22}$ and $M_{bias12}$. As will be described later, in the above-described condition, the both circuits are the almost same in input impedance and gain.

Further, as described in FIG. 5, in the present embodiment, a gate of an NMOS transistor $M_{bias11}$ (not shown) as well as the gate of the NMOS transistor $M_{21}$ is connected to an output node (that is, the output terminal $OUT_1$). However, since the sizes of the NMOS transistors $M_{21}$ and $M_{bias11}$ are about half of the sizes of the NMOS transistor $M_{22}$ of the comparative example, a capacitance as a load of an output does not change.

The other configuration is the same as in FIG. 5, and thus like parts are designated by like reference numerals, and description thereof will not be repeated.

Next, simulation results of the comparative circuits of FIGS. 6(a) and 6(b) will be described.

Figure 7:
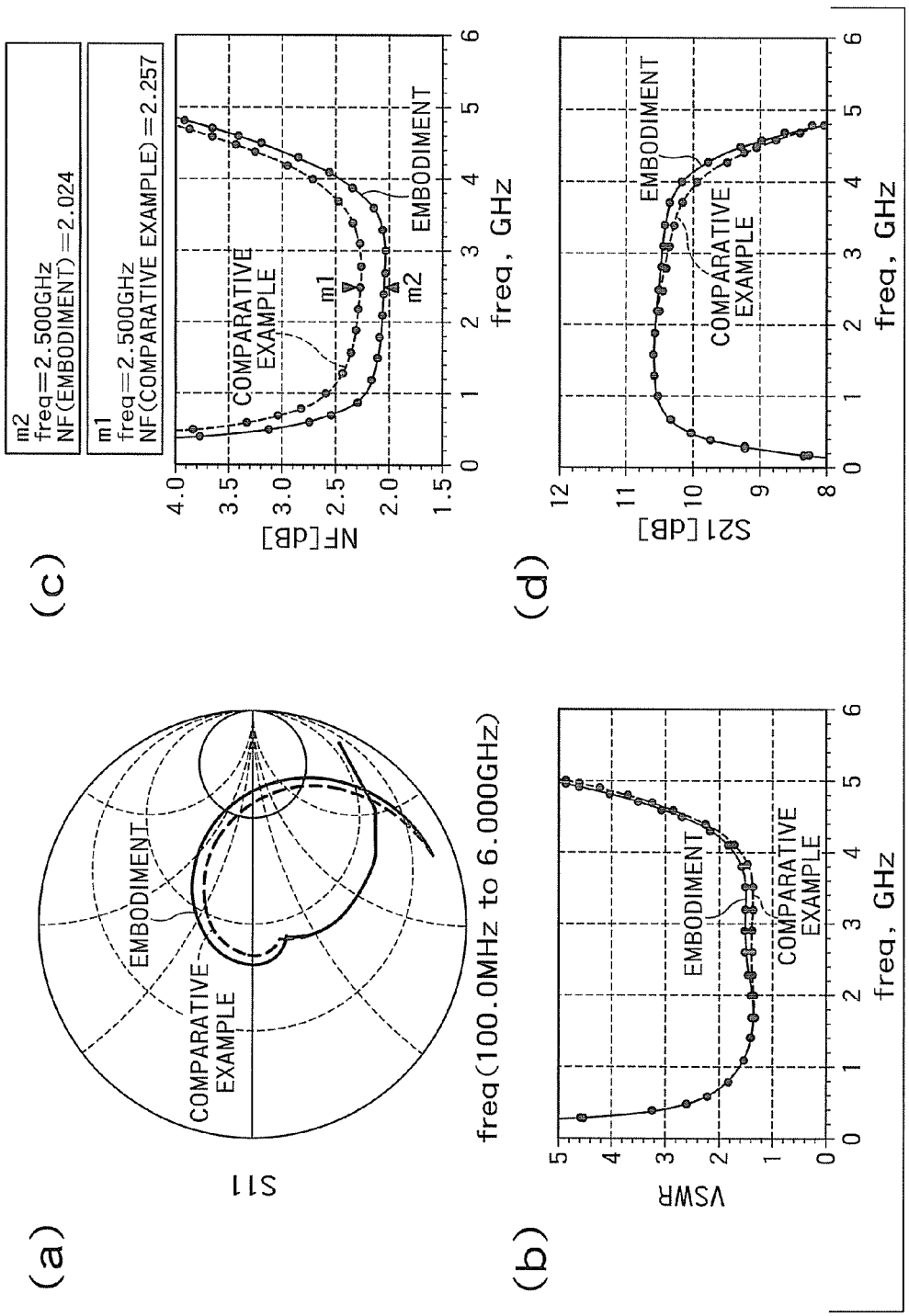
FIG. 7 is a view illustrating characteristics of the low noise amplifier according to the second embodiment of the present invention and the low noise amplifier according to the comparative example.

FIGS. 7(a) to FIG. 7(d) are views illustrating characteristics of the low noise amplifier according to the second embodiment of the present invention and the low noise amplifier according to the comparative example. FIG. 7(a) is a Smith chart illustrating an input impedance S11. FIG. 7(b) illustrates a voltage standing wave ratio (VSWR) of an input. FIG. 7(c) illustrates a noise figure (NF). FIG. 7(d) illustrates a gain 521. In FIGS. 7(b) to 7(d), a horizontal axis indicates a frequency.

As can be seen in FIGS. 7(a) to 7(d), in the condition in which the gain and the input impedance are matched, in the present embodiment, the NF is improved compared to the comparative example. For example, at a frequency of 2.5 GHz, the NF is improved from 2.257 dB to 2.024 dB.

Further, since the sizes of the NMOS transistors $M_{21}$ and $M_{bias11}$ are half of the sizes of the NMOS transistors $M_{22}$ and $M_{bias12}$, the parasitic capacitance of an input is reduced.

As described above, according to the present embodiment, since the low noise amplifiers of the first embodiments are connected to provide the differential configuration, the signal having the reverse phase can be easily input to the NMOS transistors $M_{bias1}$ and $M_{bias2}$ by inputting the respective reverse phase side output signals.

Further, the same effects as in the first embodiment are obtained.

The embodiments of the present invention have been described in detail, but the concrete configuration is not limited to the above-described embodiments, and various modifications may be made without departing from the spirit and scope of the present invention.

For example, a PMOS transistor may be used instead of an NMOS transistor.

Figure 8:
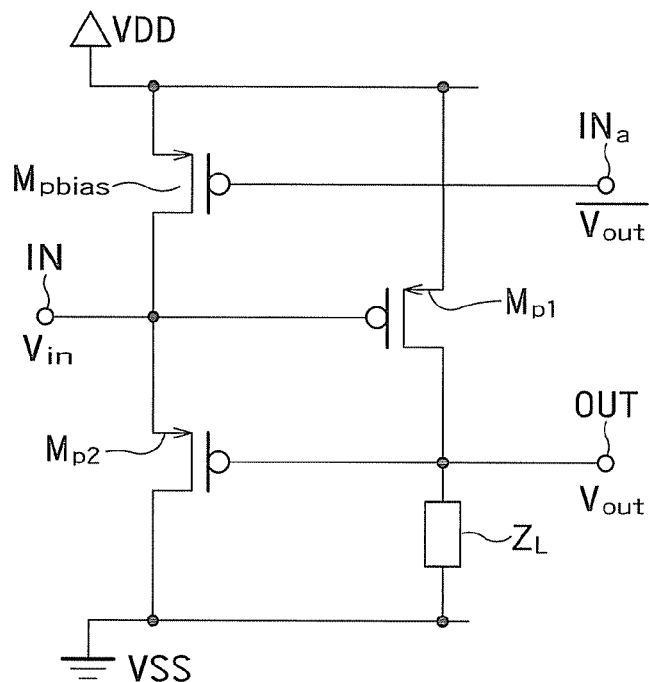
FIG. 8 is a circuit diagram of the low noise amplifier according to a modification of the first embodiment.

For example, as a modification of the first embodiment, as illustrated in FIG. 8, a low noise amplifier may be configured with PMOS transistors $M_{p1}$, $M_{p2}$, and $M_{pbias}$. The circuit of FIG. 8 operates in the same manner as in the first embodiment, and the same effects as in the first embodiment are obtained.

Figure 9:
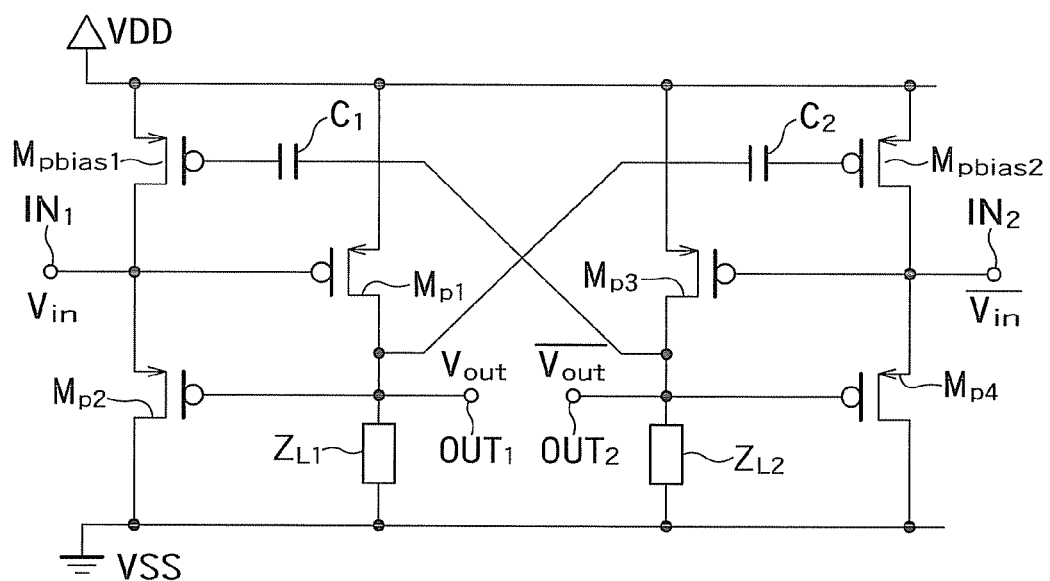
FIG. 9 is a circuit diagram of the low noise amplifier according to a modification of the second embodiment.

Further, as a modification of the second embodiment, as illustrated in FIG. 9, a low noise amplifier may be configured with PMOS transistors $M_{p1}$, $M_{p2}$, $M_{pbias1}$, $M_{p3}$, $M_{p4}$, and $M_{pbias2}$. The circuit of FIG. 9 operates in the same manner as in the second embodiment, and the same effects as in the second embodiment are obtained.

In the modification of the first embodiment and the modification of the second embodiment, a ground potential VSS is used as a first potential, and a power-supply potential VDD is used as a second potential.

Further, as the amplifier configured with the NMOS transistor $M_1$ and the load $Z_L$, any circuit having a configuration other than the above-described embodiments may be used. For example, even in the first embodiment, similarly to the comparative circuit of the second embodiment, an NMOS transistor $M_c$ may be cascode-connected between the load $Z_L$ and the drain of the NMOS transistor $M_1$.

Further, a resistor or an inductor may be used as the loads $Z_L$, $Z_{L1}$, and $Z_{L2}$.

The signal, which has the phase reverse to the output signal $V_{out}$, input to the gate of the NMOS transistor $M_{bias}$ in the first embodiment may be generated by various methods (circuits), which will be described below in third to sixth embodiments.

(Third Embodiment)

Figure 10:
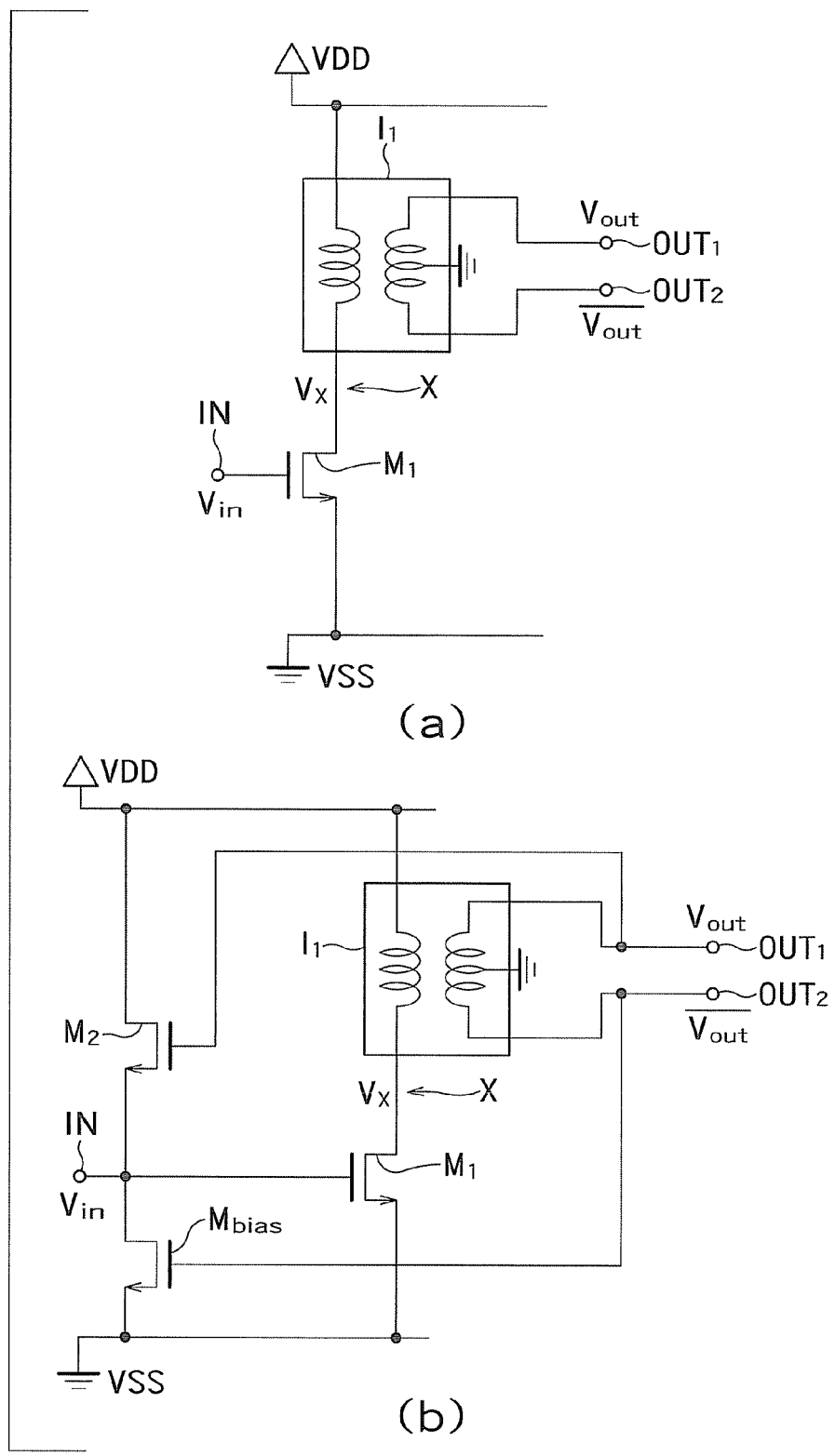
FIG. 10 is a circuit diagram of a single ended to differential conversion circuit and a low noise amplifier according to a third embodiment of the present invention.

FIG. 10(a) is a circuit diagram of a single ended to differential conversion circuit according to a third embodiment of the present invention. The circuit is an example of a circuit that generates a signal having a phase reverse to an output signal $V_{out}$ by using a device having a single ended to differential conversion function such as a transformer.

An input terminal IN is connected to a gate of an NMOS transistor $M_1$, and a drain of the NMOS transistor $M_1$ is connected to a first terminal at a primary side of a transformer $I_1$ (a signal conversion section). A second terminal at the primary side of the transformer $I_1$ is connected to a power-supply potential VDD, and the primary side of the transformer $I_1$ functions as a load of an amplifier. At a secondary side of the transformer $I_1$ a first terminal is connected to an output terminal $OUT_1$, and a second terminal is connected to an output terminal $OUT_2$. A middle point at the secondary side of the transformer $I_1$ is connected to a ground potential VSS. A signal having the same phase as a signal $V_x$ at a node X appears at the first terminal ($OUT_1$) at the secondary side of the transformer $I_1$ and a signal having a phase reverse to the signal $V_x$ appears at the second terminal ($OUT_2$).

FIG. 10(b) is a circuit diagram of a low noise amplifier according to the third embodiment of the present invention.

The circuit is a circuit that generates a signal having a phase reverse to the output signal $V_{out}$ in the first embodiment and an example in which the circuit of FIG. 10(a) is applied. The low noise amplifier of FIG. 10(b) is configured so that an output signal $V_{out}$, which has the same phase as a signal $V_x$ at a node X, appeared at the first terminal at the secondary side of the transformer $I_1$ is input to a gate of an NMOS transistor $M_2$, and a signal, which has a phase reverse to the output signal $V_{out}$, appeared at the second terminal at the secondary side of the transformer $I_1$ is input to a gate of an NMOS transistor $M_{bias}$. The other configuration is the same as in FIG. 4 in the first embodiment, and thus like parts are designated by like reference numerals, and description thereof will not be repeated.

Further, instead of the transformer $I_1$ a different circuit component having a single ended to differential conversion function may be used.

(Fourth Embodiment)

The amplifier itself may have the single ended to differential conversion function.

Figure 11:
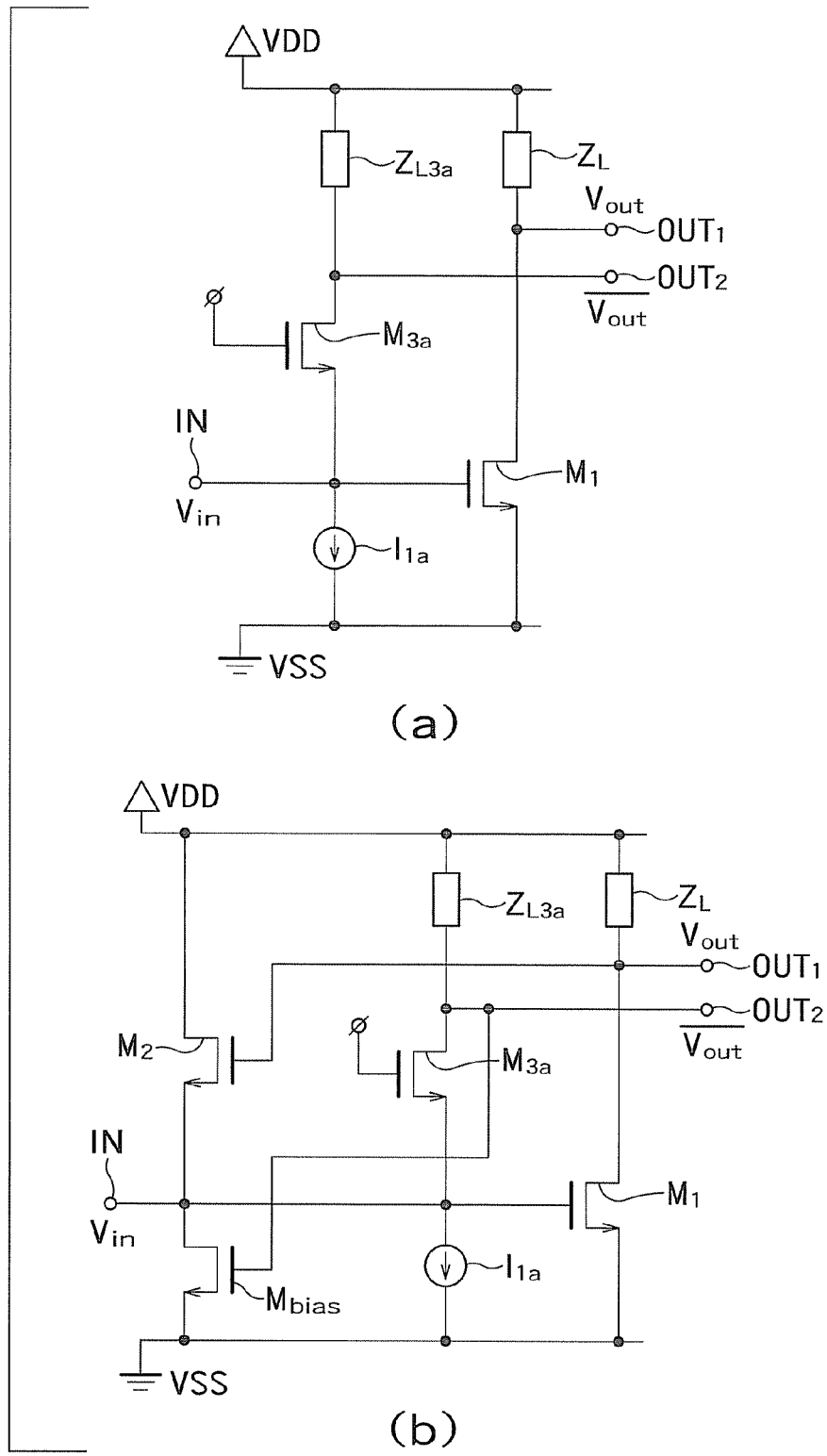
FIG. 11 is a circuit diagram of a single ended to differential conversion circuit and a low noise amplifier according to a fourth embodiment of the present invention.

FIG. 11(a) is a circuit diagram illustrating a single ended to differential conversion circuit according to a fourth embodiment of the present invention. The single ended to differential conversion circuit is an example of a circuit in which a common source circuit and common gate circuit are combined in parallel. An input terminal IN is connected to a gate of an NMOS transistor $M_1$ and a source of an NMOS transistor $M_{3a}$. A drain of the NMOS transistor $M_1$ is connected to a load $Z_L$ and an output terminal $OUT_1$. A drain of the NMOS transistor $M_{3a}$ is connected to a load $Z_{L3a}$ and an output terminal $OUT_2$. A current source $I_{1a}$ is connected between a source of the NMOS transistor $M_{3a}$ and a ground potential VSS. A bias voltage is applied to gates of the NMOS transistors $M_1$ and $M_{3a}$ so that the NMOS transistors $M_1$ and $M_{3a}$ can operate in the saturated region. The NMOS transistor $M_{3a}$ and the load $Z_{L3a}$ act as a common gate amplifier. Therefore, a signal appeared at the drain of the NMOS transistor $M_{3a}$ has a phase reverse to a signal appeared at the drain of the NMOS transistor $M_1$ that operates as a common source amplifier. Therefore, an output signal $V_{out}$ and a signal having a phase reverse to the output signal $V_{out}$ can be obtained.

A low noise amplifier to which the circuit of FIG. 11(a) is applied, as the circuit that generates the signal having the phase reverse to the output signal $V_{out}$ in the first embodiment, is configured as follows.

FIG. 11(b) is a circuit diagram of a low noise amplifier according to the fourth embodiment of the present invention. As illustrated in FIG. 11(b), the low noise amplifier includes the common gate circuit of FIG. 11(a) including the transistor $M_{3a}$, the load $Z_{L3a}$, and the current source $I_{1a}$ in addition to the configuration of the low noise amplifier of the first embodiment. The output terminal $OUT_2$ is connected to the gate of the NMOS 11(a) and FIG. 4 in the first embodiment, and thus like parts are designated by like reference numerals, and description thereof will not be repeated.

(Fifth Embodiment)

Figure 12:
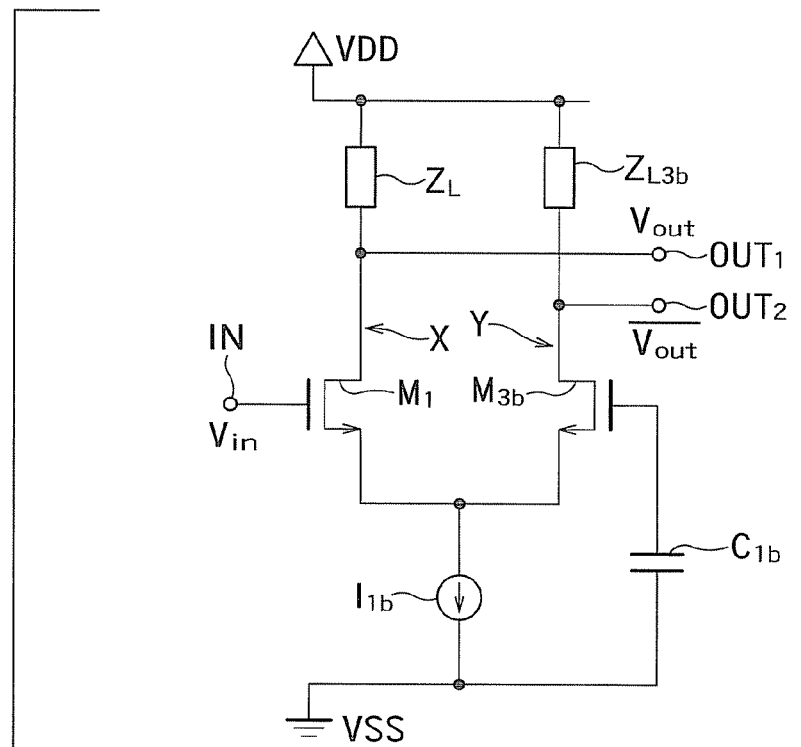
FIG. 12 is a circuit diagram of a single ended to differential conversion circuit and a low noise amplifier according to a fifth embodiment of the present invention.
Figure 12:
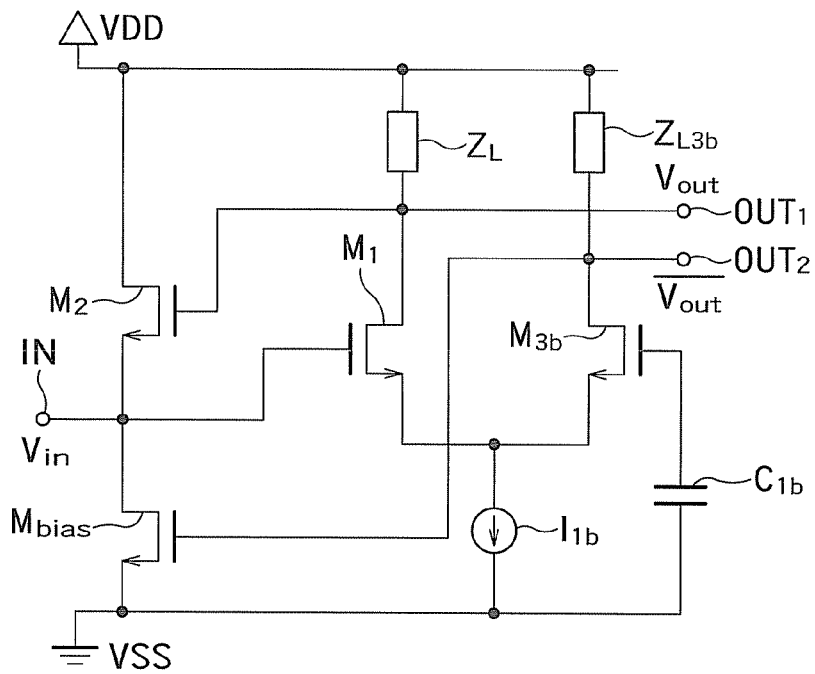

FIG. 12(a) is a circuit diagram of a single ended to differential conversion circuit according to a fifth embodiment of the present invention. The single ended to differential conversion circuit is an example of a circuit using a differential amplifier. An input terminal IN is connected to a gate of an NMOS transistor $M_1$, and a source of the NMOS transistor $M_1$ and a source of an NMOS transistor $M_{3b}$ (a fourth transistor) are connected to one terminal of a current source $I_{1b}$ (a first current source). The other terminal of the current source $I_{1b}$ is connected to a ground potential VSS. A drain of the NMOS transistor $M_1$ is connected to a load $Z_L$ and an output terminal $OUT_1$. A drain of the NMOS transistor $M_{3b}$ is connected to a load $Z_{L3b}$ (a second load) and an output terminal $OUT_2$. A bias voltage is applied to gates of the NMOS transistors $M_1$ and $M_{3b}$ so that the NMOS transistors $M_1$ and $M_{3b}$ can operate in the saturated region. The NMOS transistors $M_1$ and $M_{3b}$, the current source $I_{1b}$, and the loads $Z_L$ and $Z_{L3b}$ configure the differential amplifier, and the gate of the transistor $M_{3b}$ is AC coupled to ground through a capacitor $C_{1b}$. Since a sum of a current flowing to the NMOS transistor $M_1$ and a current flowing to the NMOS transistor $M_{3b}$ is determined by the current source $I_{1b}$, when a current flowing to a node X decreases and an electric potential at the node X is raised, a current flowing to a node Y increases, and an electric potential at the node Y drops. The electric potential at the node X and the electric potential at the node Y are always in a reverse phase relationship, and thus an output signal $V_{out}$ and a signal having a phase reverse to the output signal $V_{out}$ can be obtained.

A low noise amplifier to which the circuit of FIG. 12(a) is applied, as the circuit that generates the signal having the phase reverse to the output signal $V_{out}$ in the first embodiment, is configured as follows.

FIG. 12(b) is a circuit diagram of a low noise amplifier according to the fifth embodiment of the present invention. As illustrated in FIG. 12(b), the low noise amplifier includes a current source $I_{1b}$ between the source of the NMOS transistor $M_1$ and the ground potential VSS in the low noise amplifier of the first embodiment. The low noise amplifier further includes a part of the differential amplifying circuit including the transistor $M_{3b}$, the load $Z_{L3b}$, and the capacitor $C_{1b}$ of FIG. 12(a). The output terminal $OUT_2$ is connected to the gate of the NMOS transistor $M_{bias}$. The other configuration is the same as in FIG. 12(a) and FIG. 4 in the first embodiment, and thus like parts are designated by like reference numerals, and description thereof will not be repeated.

For example, the NMOS transistor $M_1$ and the load $Z_L$ in the circuit of FIG. 12(a) are the same as the NMOS transistor $M_1$ and the load $Z_L$ that configure the amplifier of the first embodiment of FIG. 4.

(Sixth Embodiment)

Figure 13:
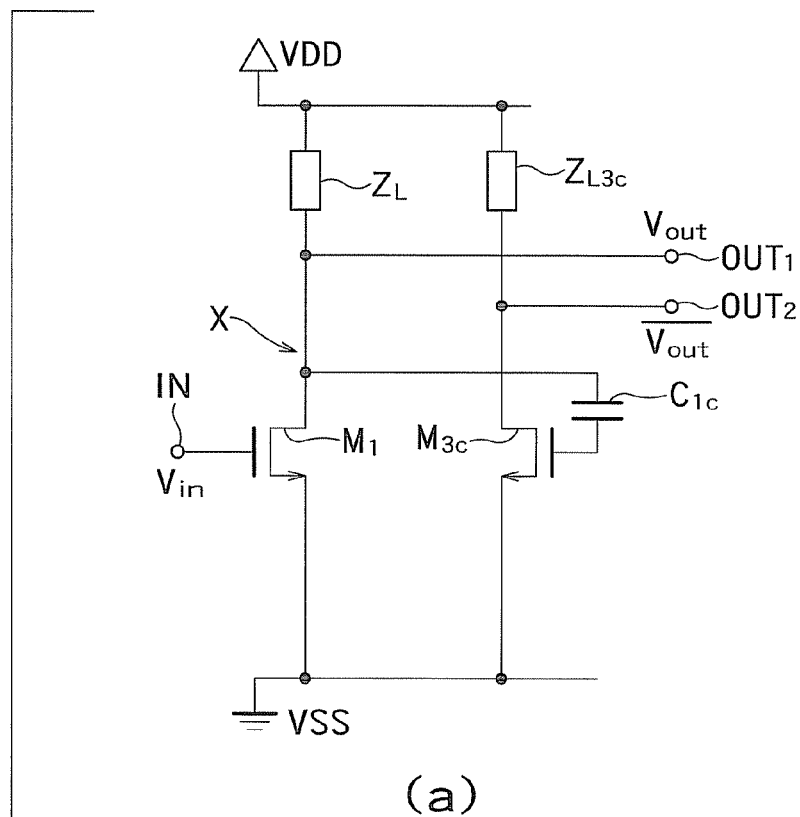
FIG. 13 is a circuit diagram of a single ended to differential conversion circuit and a low noise amplifier according to a sixth embodiment of the present invention.
Figure 13:
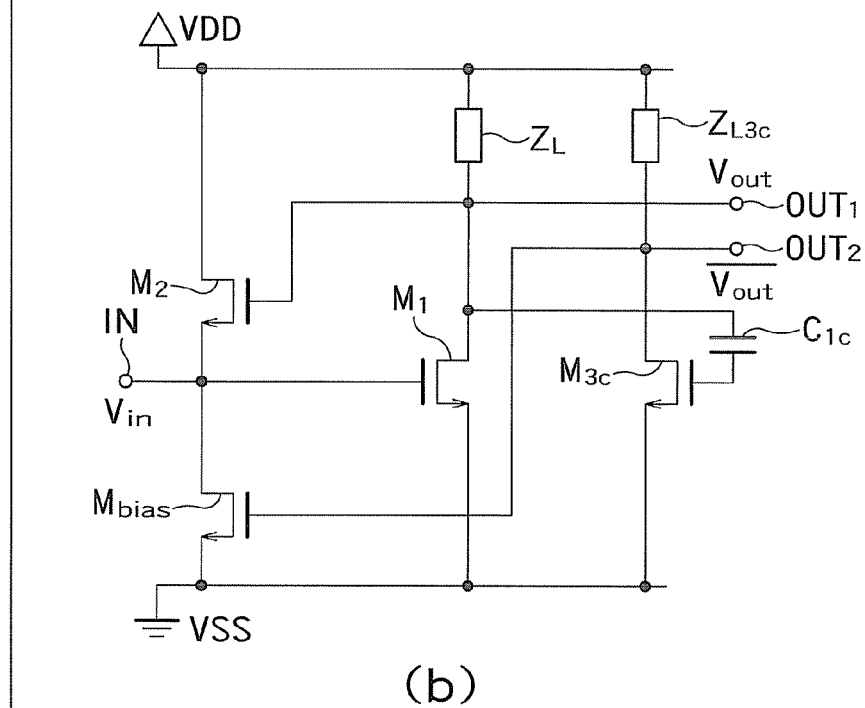

FIG. 13(a) is a circuit diagram of a single ended to differential conversion circuit according to a sixth embodiment of the present invention. The single ended to differential conversion circuit is an example of a circuit using a cascade-connection of a common source circuit. An input terminal IN is connected to a gate of an NMOS transistor $M_1$. A source of the NMOS transistor $M_1$ and a source of an NMOS transistor $M_{3c}$ (a fifth transistor) are connected to a ground potential VSS. A drain of the NMOS transistor $M_1$ is connected to a load $Z_L$ and an output terminal $OUT_1$. A drain of the NMOS transistor $M_{3c}$ is connected to a load $Z_{L3c}$ (a third load) and an output terminal $OUT_2$. The drain of the NMOS transistor $M_1$ is connected to one terminal of a capacitor $C_{1c}$ that cuts a direct current. The other terminal of the capacitor $C_{1c}$ is connected to the gate of the transistor $M_{3c}$. A bias voltage is applied to the gates of the NMOS transistors $M_1$ and $M_{3c}$ so that the NMOS transistors $M_1$ and $M_{3c}$ can operate in the saturated region. Since a signal appeared at a node X is reversed by the common source circuit including the NMOS transistor $M_{3c}$ and the load $Z_{L3C}$, an output signal $V_{out}$ and a signal having a phase reverse to the output signal $V_{out}$ can be obtained.

A low noise amplifier to which the circuit of FIG. 13(a) is applied, as the circuit that generates the signal having the phase reverse to the output signal $V_{out}$ in the first embodiment, is configured as follows.

FIG. 13(b) is a circuit diagram of a low noise amplifier according to the sixth embodiment of the present invention. As illustrated in FIG. 13(b), the low noise amplifier includes a common source circuit including the transistor $M_{3c}$, the load $Z_{L3c}$, and the capacitor $C_{1c}$ of FIG. 13(a) in addition to the configuration of the low noise amplifier of the first embodiment. The output terminal $OUT_2$ is connected to the gate of the NMOS transistor $M_{bias}$. The other configuration is the same as in FIG. 13(a) and FIG. 4 in the first embodiment, and thus like parts are designated by like reference numerals, and description thereof will not be repeated.

For example, the NMOS transistor $M_1$ and the load $Z_L$ in the circuit of FIG. 13(a) are the same as the NMOS transistor $M_1$ and the load $Z_L$ that configure the amplifier in the first embodiment of FIG. 4.

Even in the third to sixth embodiments, the same effects as in the first embodiment are obtained.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit device, comprising:
an amplifier comprising an input terminal and an output terminal, the input terminal receiving an input signal, and the output terminal outputting an output signal; and
a feedback circuit comprising a first transistor generating a bias current, the feedback circuit being configured to operate based on the bias current, and the feedback circuit being configured to receive the output signal to supply a feedback signal to the input terminal,
wherein a signal having a reverse phase to the output signal is input to a gate of the first transistor.

2. The semiconductor integrated circuit device according to claim 1,
wherein the feedback circuit further comprises a second transistor, the second transistor comprising a gate receiving the output signal, a source connected to the input terminal, and a drain connected to a first potential, the second transistor having the same conductivity type as the first transistor, and
a bias voltage is additionally applied to the gate of the first transistor, the first transistor comprising a source connected to a second potential and a drain connected to the input terminal.

3. The semiconductor integrated circuit device according to claim 1,
wherein the amplifier comprises:
a first additional transistor comprising a gate connected to the input terminal, a source connected to a second potential, and a drain connected to the output terminal, the first additional transistor having the same conductivity type as the first transistor; and
a first load connected between the drain of the first additional transistor and a first potential.

4. The semiconductor integrated circuit device according to claim 1,
wherein the amplifier comprises:
a first additional transistor comprising a gate connected to the input terminal and a source connected to a second potential, the first additional transistor having the same conductivity type as the first transistor; and
a signal conversion section including a primary circuit and a secondary circuit,
the signal conversion section outputs a signal having the same phase as a signal applied to a first terminal of the primary circuit, via a first terminal of the secondary circuit, and outputs a signal having a reverse phase to a signal applied to the first terminal of the primary circuit, via a second terminal of the secondary circuit,
the first terminal of the primary circuit is connected to the drain of the first additional transistor,
a second terminal of the primary circuit is connected to the first potential,
the first terminal of the secondary circuit is connected to the output terminal, and
the second terminal of the secondary circuit is connected to the gate of the first transistor.

5. The semiconductor integrated circuit device according to claim 3, further comprising:
a common gate circuit configured to amplify the input signal to supply the amplified signal to the gate of the first transistor, as the signal having the reverse phase to the output signal.

6. The semiconductor integrated circuit device according to claim 3, further comprising:
a first current source connected between the source of the first additional transistor and the second potential;
a second additional transistor comprising a source connected to the source of the first additional transistor, the second additional transistor having the same conductivity type as the first additional transistor;
a capacitor connected between a gate of the second additional transistor and the second potential; and
a second load connected between a drain of the second additional transistor and the first potential,
wherein the drain of the second additional transistor is connected to the gate of the first transistor.

7. The semiconductor integrated circuit device according to claim 3, further comprising:
a second additional transistor comprising a source connected to the second potential, the second additional transistor having the same conductivity type as the first additional transistor;
a capacitor connected between a gate of the second additional transistor and the drain of the first additional transistor; and
a second load connected between a drain of the second additional transistor and the first potential,
wherein the drain of the second additional transistor is connected to the gate of the first transistor.

8. The semiconductor integrated circuit device according to claim 3,
wherein the amplifier comprises a cascode transistor, the cascode transistor comprising a gate to which a cascode bias voltage is applied, a source connected to the drain of the first additional transistor, and a drain connected to the first load.

9. The semiconductor integrated circuit device according to claim 1,
wherein the feedback circuit further comprises a second transistor, the second transistor comprising a gate receiving the output signal, a source connected to the input terminal, and a drain connected to a first potential, the second transistor having the same conductivity type as the first transistor,
a bias voltage is additionally applied to the gate of the first transistor, the first transistor comprising a source connected to a second potential and a drain connected to the input terminal, and
the amplifier comprises:
a first additional transistor comprising a gate connected to the input terminal, a source connected to the second potential, and a drain connected to the output terminal, the first additional transistor having the same conductivity type as the first transistor; and
a first load connected between the drain of the first additional transistor and the first potential.

10. The semiconductor integrated circuit device according to claim 9,
wherein the first transistor, the second transistor, and the first additional transistor are N-type MOS transistors, the first potential is a power-supply potential, and the second potential is a ground potential.

11. The semiconductor integrated circuit device according to claim 9,
wherein the first transistor, the second transistor, and the first additional transistor are P-type MOS transistors, the first potential is a ground potential, and the second potential is a power-supply potential.

12. The semiconductor integrated circuit device according to claim 9,
wherein the bias voltage applied to the gate of the first transistor is set so that the first transistor, the second transistor, and the first additional transistor operate in a saturated region.

13. The semiconductor integrated circuit device according to claim 1, wherein the feedback circuit is a common drain circuit.

14. The semiconductor integrated circuit device according to claim 1, wherein the input signal is input to the input terminal from a signal source and an input impedance of the input terminal is power-matched with an impedance of the signal source.

15. A communication system, comprising:
a low noise amplifier configured to amplify a radio signal to output an output signal, the radio signal being received by an antenna, wherein the low noise amplifier comprises:
an amplifier comprising an input terminal and an output terminal, the input terminal receiving the radio signal, and the output terminal outputting the output signal; and
a feedback circuit comprising a first transistor generating a bias current, the feedback circuit being configured to operate based on the bias current, and the feedback circuit being configured to receive the output signal to supply a feedback signal to the input terminal,
a signal having a reverse phase to the output signal is input to a gate of the first transistor.

* * * * *